(12) United States Patent
Takagi

(10) Patent No.: US 9,401,681 B2
(45) Date of Patent: Jul. 26, 2016

(54) SEMICONDUCTOR AMPLIFIER

(71) Applicant: Kabushiki Kaisha Toshiba, Minato-ku (JP)

(72) Inventor: Kazutaka Takagi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/801,227

(22) Filed: Jul. 16, 2015

(65) Prior Publication Data

US 2016/0072450 A1    Mar. 10, 2016

(30) Foreign Application Priority Data

Sep. 8, 2014   (JP) ................................ 2014-182365

(51) Int. Cl.
    *H03F 3/191*      (2006.01)
    *H03F 1/30*       (2006.01)
    *H03F 3/193*      (2006.01)
              (Continued)

(52) U.S. Cl.
CPC ................ *H03F 1/301* (2013.01); *H03F 1/565* (2013.01); *H03F 3/193* (2013.01); *H03F 3/195* (2013.01); *H03F 2200/12* (2013.01); *H03F 2200/222* (2013.01); *H03F 2200/387* (2013.01); *H03F 2200/423* (2013.01); *H03F 2200/451* (2013.01)

(58) Field of Classification Search
CPC ...................................................... H03F 3/191
USPC ................................................ 330/302, 277
See application file for complete search history.

(56) References Cited

U.S. PATENT DOCUMENTS

| | | | | |
|---|---|---|---|---|
| 7,078,976 B2* | 7/2006 | Blednov | ................. | H01L 24/49 330/124 R |
| 7,119,623 B2* | 10/2006 | Blednov | ................. | H01L 24/49 330/292 |
| 7,378,920 B2* | 5/2008 | Jones | ...................... | H03F 1/565 333/22 R |

(Continued)

FOREIGN PATENT DOCUMENTS

| | | |
|---|---|---|
| EP | 2 262 107 A1 | 12/2010 |
| JP | 6-224661 A | 8/1994 |

(Continued)

OTHER PUBLICATIONS

U.S. Appl. No. 14/817,583, filed Aug. 4, 2015, Takagi.

(Continued)

*Primary Examiner* — Henry Choe
(74) *Attorney, Agent, or Firm* — Oblon, McClelland, Maier & Neustadt, L.L.P

(57) ABSTRACT

A semiconductor amplifier includes a semiconductor amplifying element, an output terminal, an output matching circuit, and an output bias circuit. The output matching circuit includes a bonding wire, a first transmission line, and a second transmission line. The other end part of the first transmission line is connected to one end part of the second transmission line. The output bias circuit includes a third transmission line having an electrical length of approximately 90° at a center frequency, a grounded shunt capacitor, and a power supply terminal. The third transmission line includes one end part and the other end part connected to the grounded shunt capacitor. The one end part of the third transmission line is connected to the second transmission line at a position where an electrical length is approximately 45° from the one end part of the second transmission line at the center frequency.

6 Claims, 9 Drawing Sheets

(51) Int. Cl.
*H03F 1/56* (2006.01)
*H03F 3/195* (2006.01)

(56) References Cited

U.S. PATENT DOCUMENTS

| | | | |
|---|---|---|---|
| 8,299,856 B2* | 10/2012 | Blair | H01L 23/66 330/302 |
| 8,604,883 B2 | 12/2013 | Takagi et al. | |
| 8,643,438 B2 | 2/2014 | Takagi et al. | |
| 8,653,896 B2 | 2/2014 | Takagi et al. | |
| 8,717,102 B2* | 5/2014 | Wilson | H03F 3/193 330/124 R |
| 2009/0167438 A1 | 7/2009 | Yang et al. | |
| 2013/0234794 A1 | 9/2013 | Takagi | |

FOREIGN PATENT DOCUMENTS

| | | |
|---|---|---|
| JP | 2009-207060 | 9/2009 |
| JP | 4936965 | 5/2012 |
| JP | 2014-207332 | 10/2014 |
| JP | 2014-207333 | 10/2014 |
| JP | 2014-207576 | 10/2014 |
| JP | 5642048 | 12/2014 |
| JP | 2015-149626 A | 8/2015 |
| JP | 2015-149627 A | 8/2015 |

OTHER PUBLICATIONS

Extended European Search Report issued Jan. 21, 2016 in Patent Application No. 15175549.3.

* cited by examiner

US 9,401,681 B2

SEMICONDUCTOR AMPLIFIER

CROSS-REFERENCE TO RELATED APPLICATIONS

This application is based upon and claims the benefit of priority from Japanese Patent Application No. 2014-182365, filed on Sep. 8, 2014; the entire contents of which are incorporated herein by reference.

FIELD

Embodiments described herein relate generally a semiconductor amplifier.

BACKGROUND

Semiconductor amplifier elements such as HEMT (high electron mobility transistor) can be used to provide a microwave semiconductor amplifier.

High-efficiency operation requires controlling harmonics. Specifically, load impedance for the second harmonic is preferably made near-open at the end part of the output electrode of the semiconductor element.

Semiconductor amplifying elements such as HEMT need supplying DC power to the electrodes. Thus, the package housing a semiconductor amplifier may be provided with a bias circuit besides an input matching circuit and an output matching circuit.

Preferably, this bias circuit does not affect the matching circuit at the fundamental signal. Thus, the bias circuit is configured to have a near-open impedance at the connection point with the matching circuit. Specifically, the bias circuit is composed of a line having an electrical length of approximately 90° at the center frequency of the fundamental signal, and a grounded shunt capacitor connected to the tip of the transmission line. Then the bias circuit has a near-open impedance at the fundamental frequency. However, the bias circuit has a near-short impedance at the second harmonic frequency because an electrical length becomes approximately 180° between the grounded shunt capacitor and the connection point with the matching circuit.

DETAILED DESCRIPTION

In general, according to one embodiment, a semiconductor amplifier includes a semiconductor amplifying element, an output terminal, an output matching circuit, and an output bias circuit. The semiconductor amplifying element includes an input electrode and an output electrode. The output terminal is connected with an external load. The output matching circuit includes a bonding wire, a first transmission line having a first characteristic impedance and a first electrical length, and a second transmission line having a second characteristic impedance and a second electrical length. The bonding wire includes one end part connected to the output electrode and the other end part connected to one end part of the first transmission line. The other end part of the first transmission line is connected to one end part of the second transmission line. The other end part of the second transmission line is connected to the output terminal. The first electrical length is 90° or less at an upper limit frequency of the prescribed band. The second characteristic impedance is larger than the first characteristic impedance. The output bias circuit includes a third transmission line having an electrical length of approximately 90° at a center frequency in a prescribed band, a grounded shunt capacitor, and a power supply terminal. The third transmission line includes one end part and the other end part connected to the grounded shunt capacitor. The one end part of the third transmission line is connected to the second transmission line at a position where an electrical length is approximately 45° from the one end part of the second transmission line at the center frequency. The power supply terminal is connected to the other end part of the third transmission line.

Embodiments of the invention will now be described with reference to the drawings.

Figure 1:
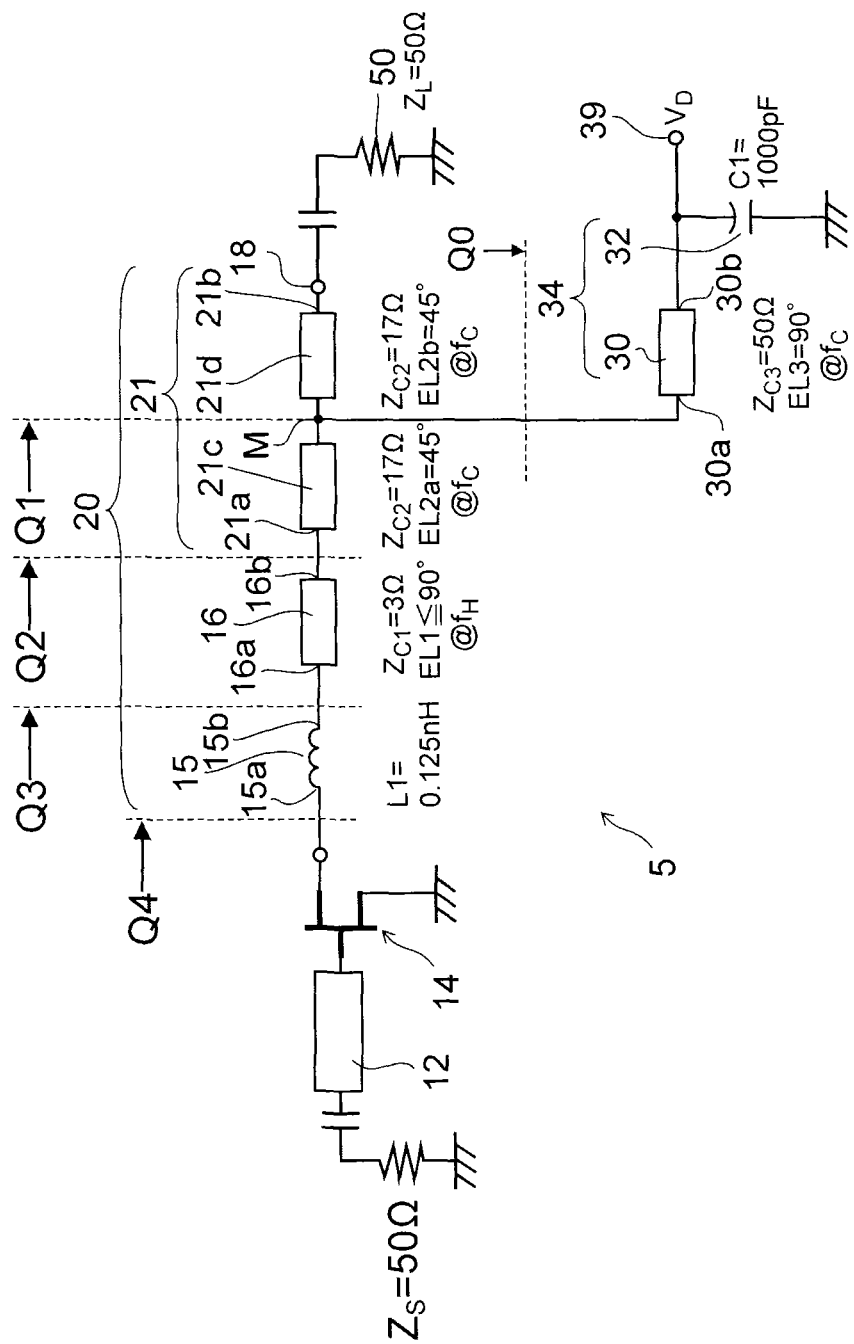
FIG. 1 is a circuit diagram of a semiconductor amplifier according to a first embodiment.

FIG. 1 is a circuit diagram of a semiconductor amplifier according to a first embodiment.

The semiconductor amplifier 5 includes a semiconductor amplifying element 14, an input matching circuit 12, an output matching circuit 20, and an output bias circuit 34.

The semiconductor amplifying element 14 is made of e.g. HEMT or FET (field effect transistor). The semiconductor amplifying element 14 includes e.g. an input electrode (e.g., gate electrode), an output electrode (e.g., drain electrode), and a ground electrode (e.g., source electrode). The semiconductor amplifying element 14 can include nitride-based semiconductor or $Al_xGa_{1-x}As$-based ($0 \leq x \leq 1$) semiconductor.

The output matching circuit 20 includes a bonding wire 15, a first transmission line 16, and a second transmission line 21. The first transmission line 16 has a first characteristic impedance $Z_{C1}$ and a first electrical length EL1. The second transmission line 21 has a second characteristic impedance $Z_{C2}$ and a second electrical length (EL2a+EL2b). The bonding wire 15 includes one end part 15a and the other end part 15b. The one end part 15a is connected to the end part (output electrode) of the semiconductor amplifying element 14. The other end part 15b is connected to one end part 16a of the first transmission line 16. The other end part 16b of the first transmission line 16 is connected to one end part 21a of the second transmission line 21. The other end part 21b of the second transmission line 21 is connected to the output terminal 18 of the semiconductor amplifier 5.

The first electrical length EL1 is 90° or less at the upper limit frequency $f_H$. The second characteristic impedance $Z_{C2}$ is higher than the first characteristic impedance $Z_{C1}$ and lower than the resistance $Z_L$ of the external load 50. The reference plane Q3 is set to the position at which the first transmission line 16 is connected to the bonding wire 15 from the output electrode 14b of the semiconductor amplifying element 14. Thus, the first electrical length EL1 is slightly shorter than the physical length of the first transmission line 16.

The output bias circuit 34 includes a third transmission line 30, a grounded shunt capacitor 32, and a power supply terminal 39. The electrical length EL3 of the third transmission line 30 at the center frequency $f_C$ is approximately 90°. The third transmission line 30 includes one end part 30a and the other end part 30b. The one end part 30a is connected to the second transmission line 21 at the position where the electrical length EL2 at the center frequency $f_C$ is approximately 45° from the one end part 21a toward the other end part 21b. The other end part 30b is connected to the grounded shunt capacitor 32. The grounded shunt capacitor 32 is configured to ground high frequency signals.

In this specification, an electrical length of approximately 90° corresponds to an angle of 81° or more and 99° or less. An electrical length of approximately 45° corresponds to 40.5° or more and 49.5° or less.

The power supply terminal 39 is connected to the other end part 30b. In the case where the semiconductor amplifying element 14 is HEMT, a DC voltage VD is supplied to the drain electrode.

Figure 2:
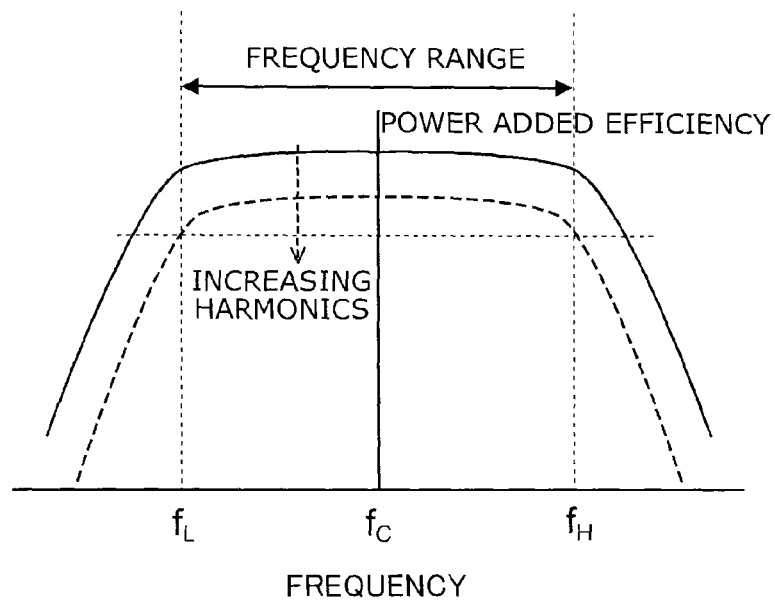
FIG. 2 is a graph for describing the band of the semiconductor amplifier.

FIG. 2 is a graph for describing the band of the semiconductor amplifier.

The semiconductor amplifier has a prescribed band adapted to the requirement. The band can be defined as e.g. the frequency range between the lower limit frequency $f_L$ and the upper limit frequency $f_H$ at which the power added efficiency decreases by a prescribed amount from its peak value. The center frequency $f_C$ is a frequency located generally at the center. The power added efficiency is lower at frequencies where the load impedance for the fundamental or higher harmonics deviates from the desired value.

Figure 3:
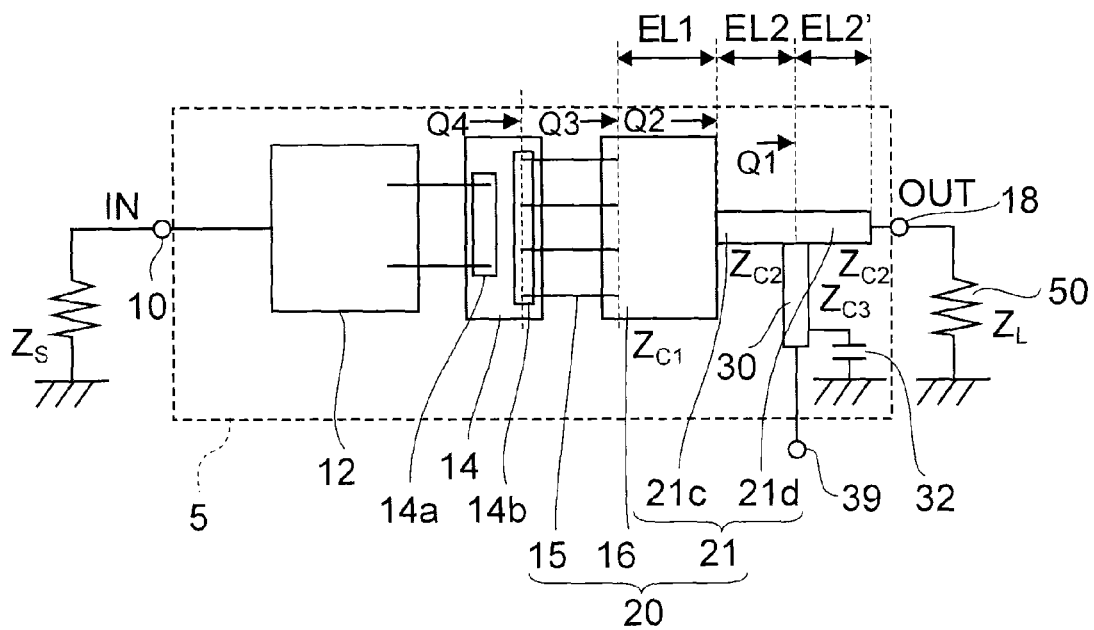
FIG. 3 is a schematic plan view of the semiconductor amplifier according to the first embodiment.

FIG. 3 is a schematic plan view of the semiconductor amplifier according to the first embodiment.

The semiconductor amplifier 5 can further include an input terminal 10, an input matching circuit 12, and an output terminal 18. The semiconductor amplifier 5 is installed in e.g. a package shown by the dashed line. The ground surface can be provided on e.g. the bottom surface side of the package.

Figure 4:
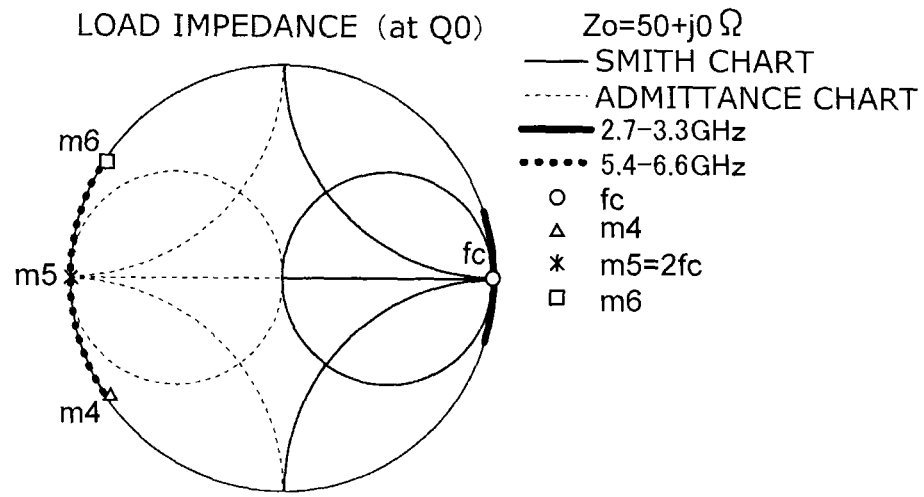
FIG. 4 is a Smith chart showing the load impedance of the output bias circuit alone seen from the reference plane Q0.

FIG. 4 is a Smith chart showing the load impedance of the output bias circuit alone seen from the reference plane Q0.

It is found that the load impedance is near-open at the fundamental signal (designed herein as 2.7-3.3 GHz) and near-short at the second harmonic signal.

FIGS. 5 to 8 described below are Smith charts showing the load impedance seen from the respective reference planes in the first embodiment. In the following description, it is assumed that the first transmission line 16 has a first electrical length EL1=90° (at $f_H$). However, it is only necessary that the first electrical length EL1≤90° (at $f_H$). Furthermore, it is assumed that $f_L$=2.7 GHz, $f_C$=3 GHz, and $f_H$=3.3 GHz. Each Smith chart is normalized by the characteristic impedance $Z_0$ close to the impedance for the fundamental signal so as to facilitate comparison with the impedance for the fundamental signal.

Figure 5:
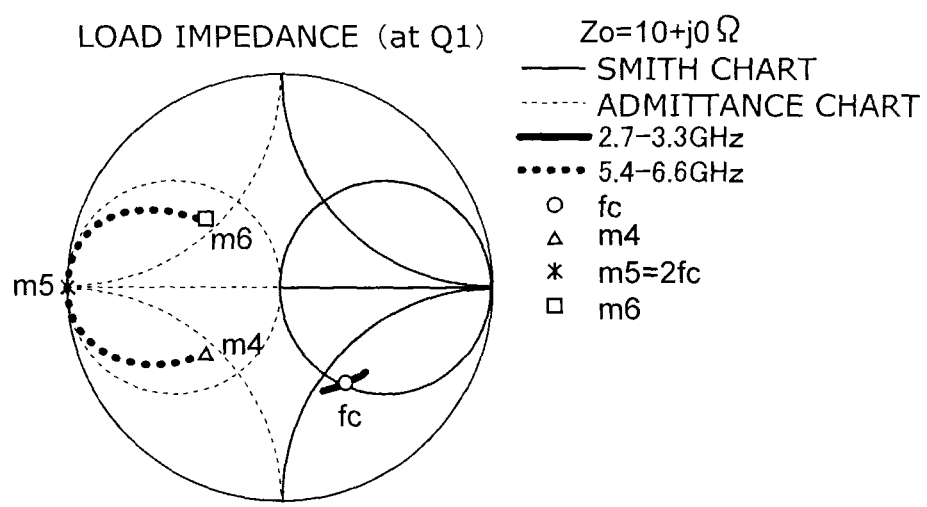
FIG. 5 is a Smith chart showing the load impedance for the fundamental and second harmonic signals seen from the reference plane Q1 where the output bias circuit is connected to the second transmission line.

FIG. 5 is a Smith chart showing the load impedance for the fundamental and second harmonic signals seen from the reference plane Q1 where the output bias circuit is connected to the second transmission line.

The bias circuit 34 has a near-short impedance at the second harmonic. As a result, the load impedances from the impedance m4 at frequency $2f_L$ (=5.4 GHz), i.e., twice the lower limit frequency $f_L$, to the impedance m6 at frequency $2f_H$ (=6.6 GHz), i.e., twice the upper limit frequency $f_H$, are near short-circuit (zero).

Figure 6:
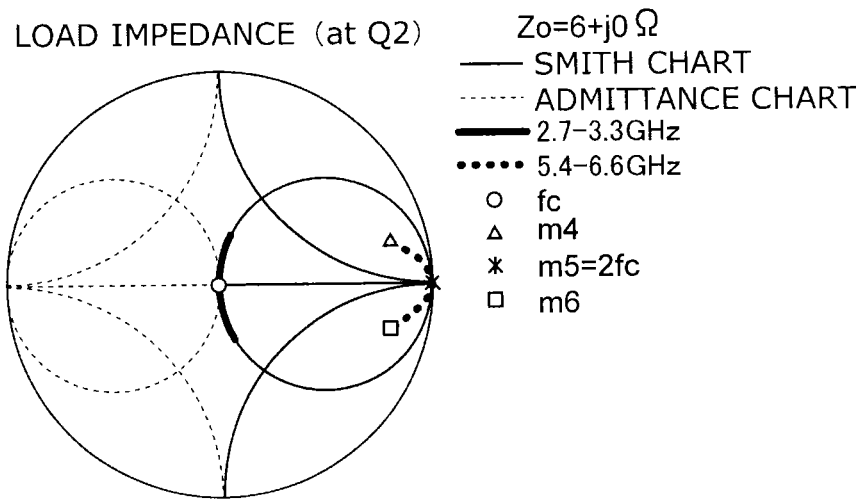
FIG. 6 is a Smith chart of the load impedance for the fundamental and second harmonic signals seen from the reference plane Q2 where the first transmission line is connected to the second transmission line.

FIG. 6 is a Smith chart of the load impedance for the fundamental and second harmonic signal seen from the reference plane Q2 where the first transmission line is connected to the second transmission line.

The second electrical length EL2a of the second transmission line 21 is 45° (at $f_C$). At the second harmonic, the second transmission line 21 acts as a quarter-wave impedance transformer. Thus, the second harmonic impedance converges to near-open at frequencies between $2f_L$ (=5.4 GHz) and $2f_H$ (=6.6 GHz).

The characteristic impedance $Z_{C3}$ of the third transmission line 30 is made higher than the characteristic impedance $Z_{C2}$ of the second transmission line 21. This is preferable because the fundamental impedance of the output bias circuit 34 seen from the reference plane Q2 can be made higher.

Figure 7:
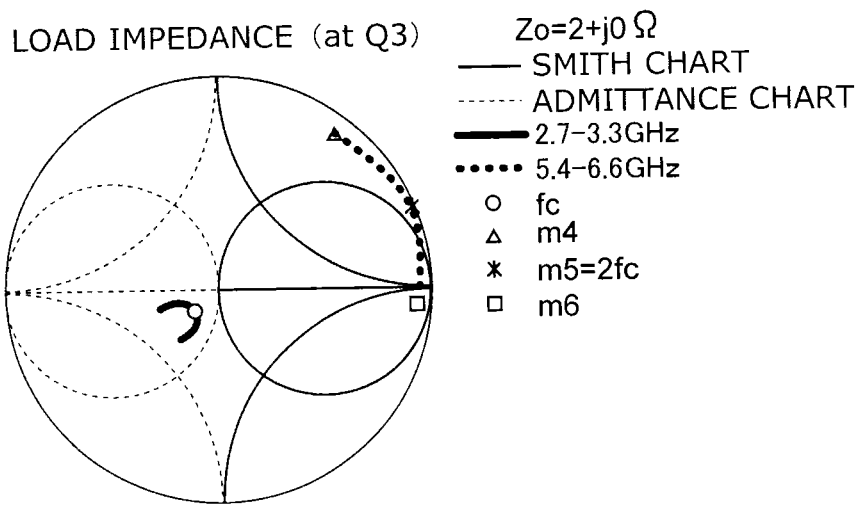
FIG. 7 is a Smith chart showing the load impedance for the fundamental and second harmonic signals seen from the reference plane Q3 where the bonding wire is connected to the first transmission line.

FIG. 7 is a Smith chart showing the load impedance for the fundamental and second harmonic signals seen from the reference plane Q3 where the bonding wire is connected to the first transmission line.

By the relation of first electrical length EL1≤90° (at $f_H$), the load impedance for the second harmonic can be made inductive and near-open. Thus, the second harmonic impedance can be made near-open in the range of $2f_L$-$2f_H$.

Figure 8:
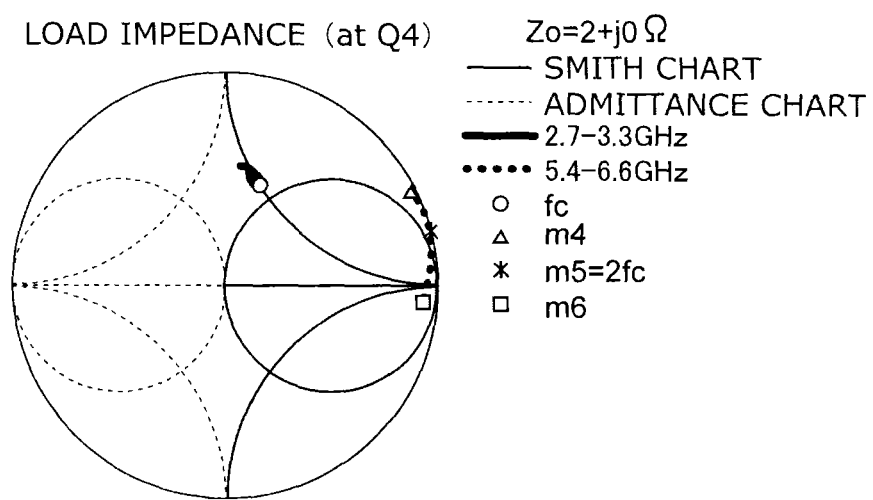
FIG. 8 is a Smith chart of the load impedance for the fundamental and second harmonic signals seen from the reference plane Q4, i.e., one end part of the bonding wire.

FIG. 8 is a Smith chart of the load impedance for the fundamental and second harmonic signals seen from the reference plane Q4, i.e., one end part of the bonding wire.

One end part 15a of the bonding wire 15 is connected to the output electrode 14b of the semiconductor amplifying element 14 (e.g., drain electrode of HEMT). The inductive reactance of the bonding wire 15 is added to the load impedance at the reference plane Q3. Thus, the load impedance for the second harmonic further converges to near-open. This facilitates high-efficiency operation.

Figure 9A:
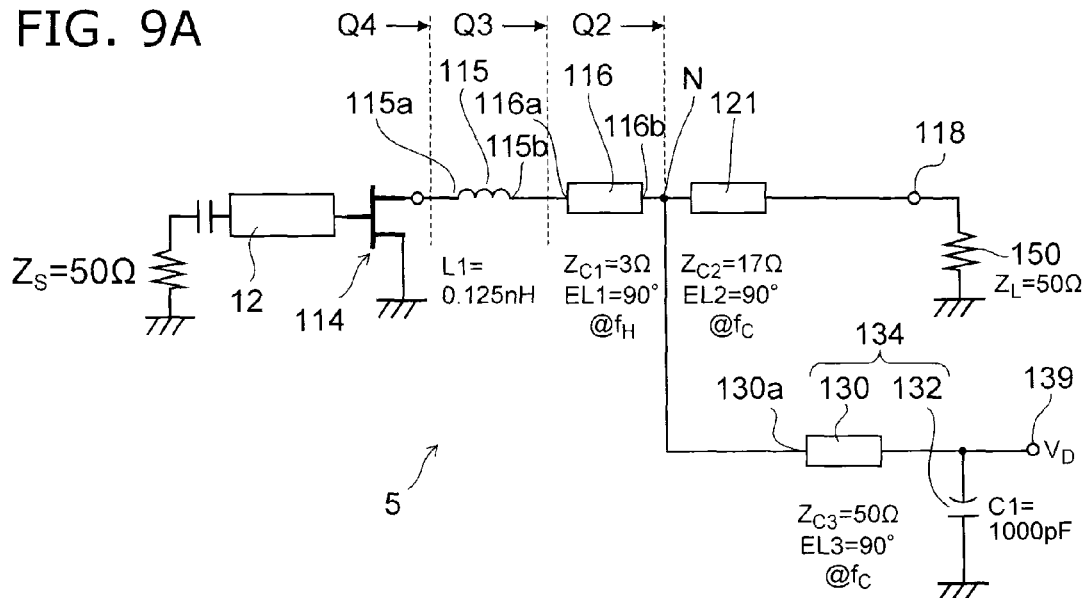
FIG. 9A is a circuit diagram of a semiconductor amplifier of a first comparative example.
Figure 9B:
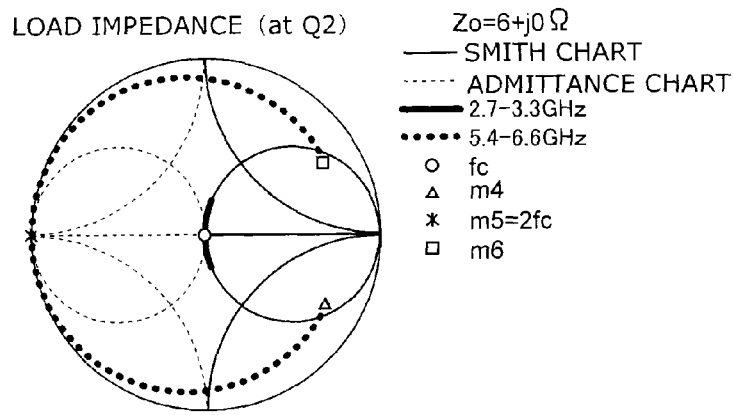
FIG. 9B is a Smith chart showing the load impedance seen from position N.
Figure 9C:
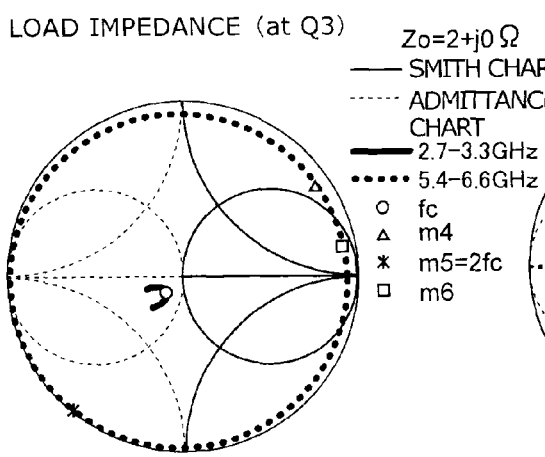
FIG. 9C is a Smith chart showing the load impedance seen from the reference plane Q3.
Figure 9D:
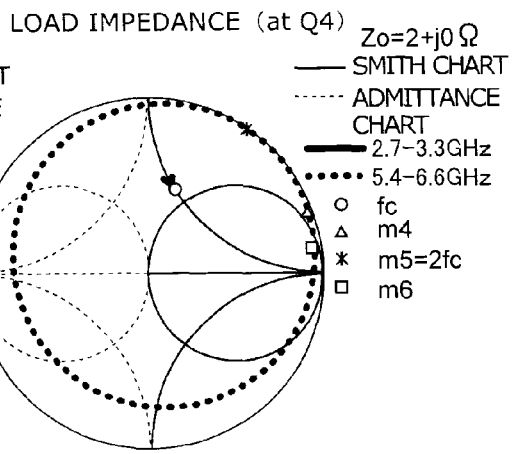
FIG. 9D is a Smith chart showing the load impedance seen from the reference plane Q4.

FIG. 9A is a circuit diagram of a semiconductor amplifier of a first comparative example. FIG. 9B is a Smith chart showing the load impedance seen from position N. FIG. 9C is a Smith chart showing the load impedance seen from the reference plane Q3. FIG. 9D is a Smith chart showing the load impedance seen from the reference plane Q4.

As shown in FIG. 9A, one end part 130a of the third transmission line 130 constituting the output bias circuit 134 is connected to the connection position N of the other end part 116b of the first transmission line 116 and one end part 121a of the second transmission line 121.

As shown in FIG. 9B, the load impedance for the second harmonic (at $2f_C$) seen from the position N connected with the output bias circuit 134 is near-short.

FIG. 9C is a Smith chart showing the load impedance seen from the reference plane Q3 where the bonding wire 115 is connected to the first transmission line 116. The locus of the load impedance for the second harmonic spreads at the end part 116b of the first transmission line 116 (equal to the connection position N). Thus, the load impedance for the second harmonic seen from the reference plane Q3 significantly changes and deviates from open-circuit at most frequencies in the band.

Even if the inductive reactance of the bonding wire 15 is added to the load impedance at the reference plane Q3, the load impedance for the second harmonic does not converge as shown in FIG. 9D. The second harmonic impedance (m4-m6) seen from the reference plane Q4 significantly changes and deviates from open-circuit at most frequencies in the band.

The change of the fundamental impedance (m1-m3) is small. The fundamental impedance is matched with the capacitive output impedance of the semiconductor amplifying element 114 in the band. However, the load impedance for the second harmonic cannot be converged to near-open. This decreases the power added efficiency.

Figure 10A:
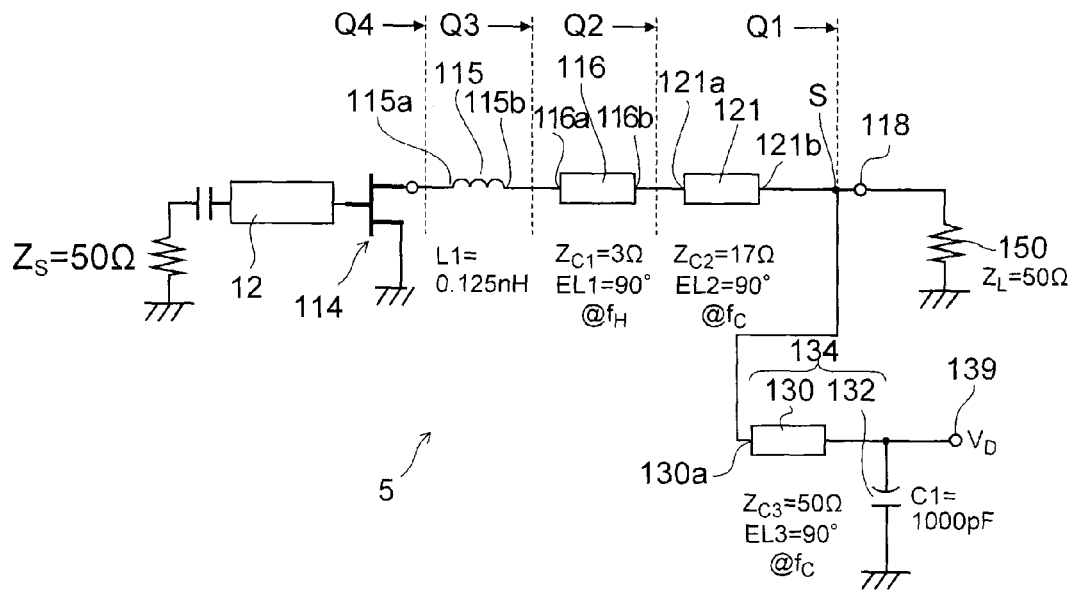
FIG. 10A is a circuit diagram of a semiconductor amplifier of a second comparative example.
Figure 10B:
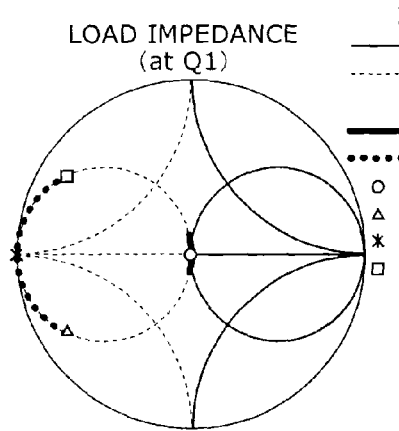
FIG. 10B is a Smith chart showing the load impedance seen from the reference plane Q1.
Figure 10C:
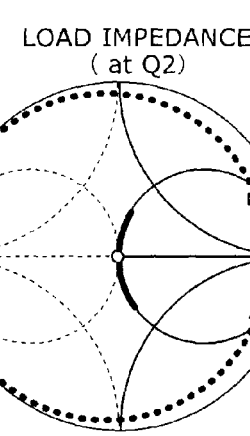
FIG. 10C is a Smith chart showing the load impedance seen from the reference plane Q2.
Figure 10C:
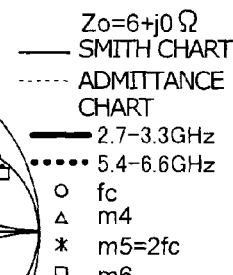
Figure 10D:
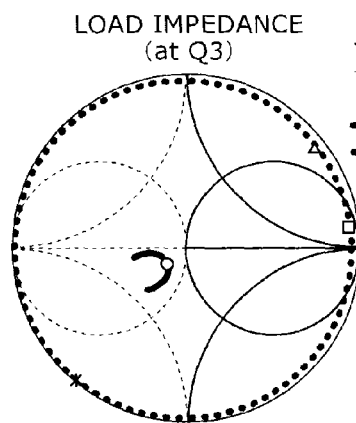
FIG. 10D is a Smith chart showing the load impedance seen from the reference plane Q3.
Figure 10E:
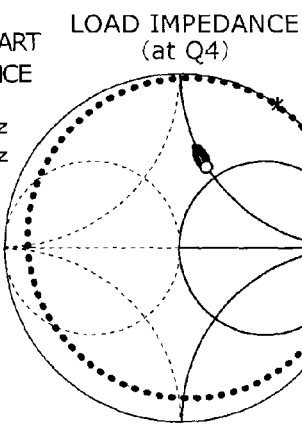
FIG. 10E is a Smith chart showing the load impedance seen from the reference plane Q4.

FIG. 10A is a circuit diagram of a semiconductor amplifier of a second comparative example. FIG. 10B is a Smith chart showing the load impedance seen from the reference plane Q1. FIG. 10C is a Smith chart showing the load impedance seen from the reference plane Q2. FIG. 10D is a Smith chart showing the load impedance seen from the reference plane Q3. FIG. 10E is a Smith chart showing the load impedance seen from the reference plane Q4.

As shown in FIG. 10A, one end part 130a of the third transmission line 130 constituting the output bias circuit 134 is connected to the connection position S of the other end part 121b of the second transmission line 121 and the output terminal 118.

FIG. 10B shows the load impedance for the fundamental and second harmonic signals seen from the reference plane Q1, i.e., the position S connected with the output bias circuit 134. The load impedance for the second harmonic is near-short.

FIG. 10C is a Smith chart showing the load impedance seen from the reference plane Q2 where the first transmission line is connected to the second transmission line. FIG. 10D is a Smith chart showing the load impedance seen from the reference plane Q3 where the bonding wire is connected to the first transmission line. The locus of the load impedance for the second harmonic spreads at the end part 116b of the first transmission line 116 (equal to the connection position N). Thus, the load impedance for the second harmonic seen from the reference plane Q3 significantly changes and deviates from open-circuit at most frequencies in the band.

Even if the inductive reactance of the bonding wire 15 is added to the load impedance at the reference plane Q3, the load impedance for the second harmonic does not converge as shown in FIG. 10E. The second harmonic impedance (m4-m6) seen from the reference plane Q4 significantly changes and deviates from open-circuit at most frequencies in the band.

The change of the fundamental impedance (m1-m3) is small. The fundamental impedance is matched with the capacitive output impedance of the semiconductor amplifying element 114 in the band. However, the load impedance for the second harmonic cannot be converged to near-open. This decreases the power added efficiency.

Figure 11A:
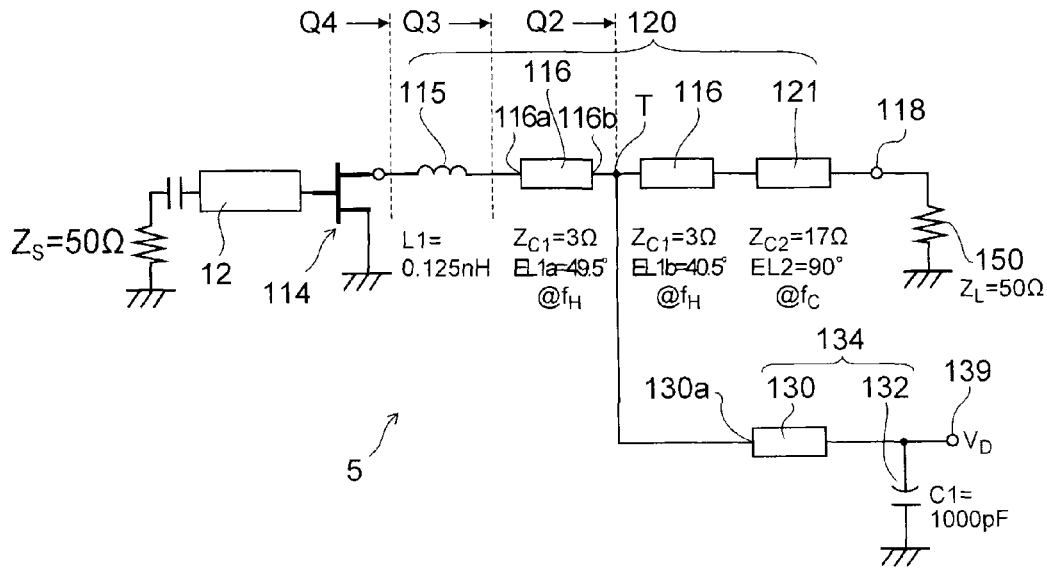
FIG. 11A is a circuit diagram of a semiconductor amplifier of a third comparative example.
Figure 11B:
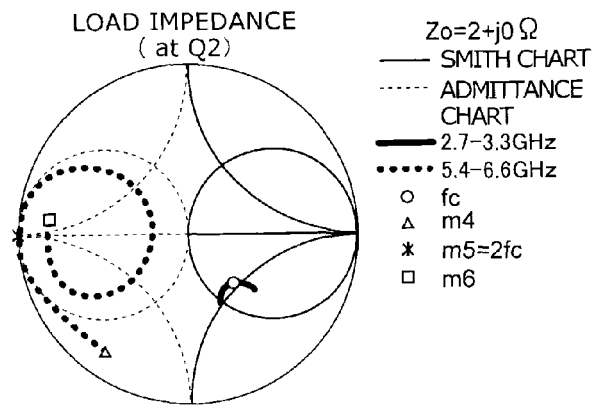
FIG. 11B is a Smith chart showing the load impedance seen from the reference plane Q2.
Figure 11C:
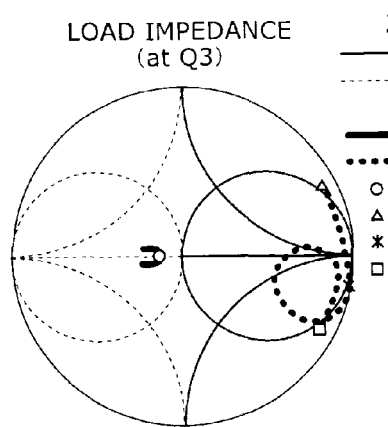
FIG. 11C is a Smith chart showing the load impedance seen from the reference plane Q3.
Figure 11D:
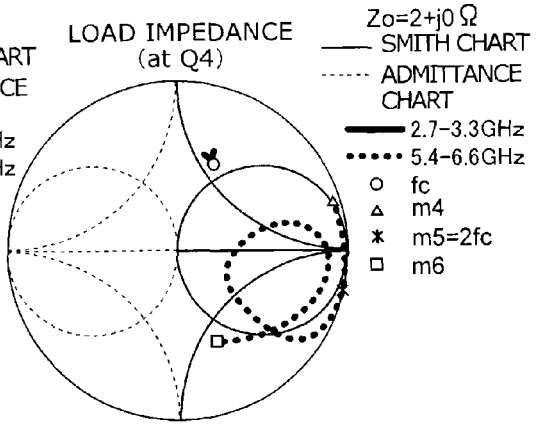
FIG. 11D is a Smith chart showing the load impedance seen from the reference plane Q4.

FIG. 11A is a circuit diagram of a semiconductor amplifier of a third comparative example. FIG. 11B is a Smith chart showing the load impedance seen from the reference plane Q2. FIG. 11C is a Smith chart showing the load impedance seen from the reference plane Q3. FIG. 11D is a Smith chart showing the load impedance seen from the reference plane Q4.

As shown in FIG. 11A, one end part 130a of the third transmission line 130 constituting the output bias circuit 134 is connected to position T spaced by 49.5° (at $f_H$) from one end part 116a toward the other end part 116b of the first transmission line 116.

FIG. 11B is a Smith chart showing the load impedance for the fundamental and second harmonic (at $2f_C$) seen from the position T connected with the output bias circuit 134. The load impedance for the second harmonic approaches short-circuit, but is distributed widely.

FIG. 11C is a Smith chart showing the load impedance seen from the reference plane Q3 where the bonding wire is connected to the first transmission line. The load impedance for the second harmonic seen from the reference plane Q3 approaches near-open, but does not converge, because of the spread of the locus of the load impedance for the second harmonic at the reference plane Q2. Thus, the load impedance is capacitive at many frequencies in the band.

FIG. 11D is a Smith chart showing the load impedance seen from the reference plane Q4 where the semiconductor amplifying element 114 is connected to the bonding wire 115. The load impedance for the second harmonic deviates from open-circuit at most frequencies in the band.

The change of the fundamental impedance (m1-m3) is small. The fundamental impedance is matched with the capacitive output impedance of the semiconductor amplifying element 114 in the band. However, the load impedance for the second harmonic cannot be converged to near-open. This decreases the power added efficiency.

Thus, it is difficult to converge the load impedance for the second harmonic to near-open even if the position T of the output bias circuit 134 is changed in the first transmission line 116.

The characteristic impedance of the transmission line is determined primarily so as to match the fundamental impedance. The impedance $Z_L$ of the external load 50 may be 50Ω. The output impedance of the semiconductor amplifying element 14 may be capacitive, and its resistive component may be as low as several Ω or less. In this case, fundamental matching is facilitated by setting as $Z_{C1} < Z_{C2} < 50Ω$.

The load impedance seen from the connection point of the bias circuit is a parallel circuit of the matching circuit and the bias circuit between the connection point and the output terminal. The frequency at which the load impedance of the bias circuit seen from the connection point is short-circuit is equal to the frequency of the second harmonic. At this frequency, the load impedance is short-circuit irrespective of the impedance of the matching circuit between the connection point and the output terminal. However, at the other frequencies, the locus of the load impedance spreads under the influence of the matching circuit between the connection point and the output terminal. The influence can be reduced when the characteristic impedance of the matching circuit between the connection point and the output terminal is higher. That is, in the transmission line nearest to the output terminal, it is preferable to provide an output bias circuit 34 between the ground and the position where the electrical length from one end part of the transmission line is approximately 45°.

Figure 12A:
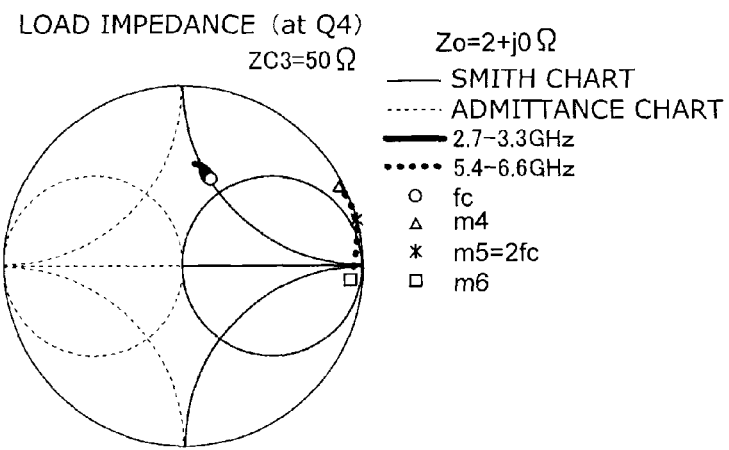
FIG. 12A is a Smith chart showing the load impedance seen from the reference plane Q4, i.e., the connection position of the semiconductor element and the bonding wire, when the characteristic impedance of the third transmission line is approximately three times the characteristic impedance of the second transmission line.
Figure 12B:
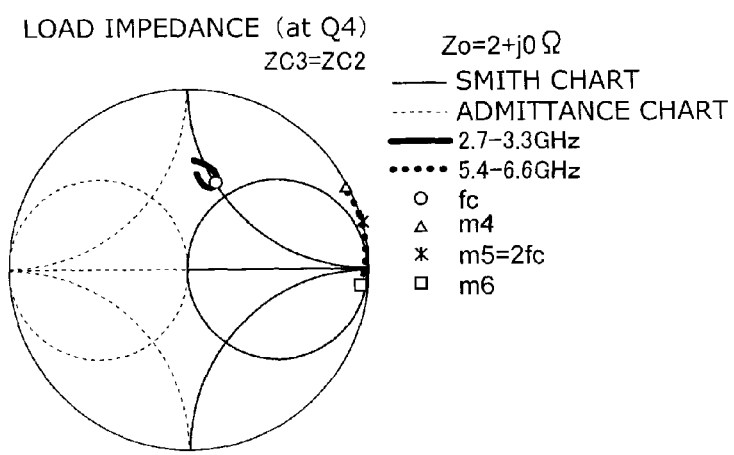
FIG. 12B is a Smith chart showing the load impedance seen from the reference plane Q4 when the characteristic impedance of the third transmission line is approximately equal to the characteristic impedance of the second transmission line.

FIG. 12A is a Smith chart showing the load impedance seen from the reference plane Q4, i.e., the connection position of the semiconductor element and the bonding wire, when the characteristic impedance of the third transmission line is approximately three times the characteristic impedance of the second transmission line. FIG. 12B is a Smith chart showing the load impedance seen from the reference plane Q4 when the characteristic impedance of the third transmission line is approximately equal to the characteristic impedance of the second transmission line.

The third characteristic impedance $Z_{C3}$ of the third transmission line 30 is preferably made higher as long as the semiconductor amplifying element 14 can be supplied with current and a narrow line width can be processed.

This embodiment provides a semiconductor amplifier including an output bias circuit and an output matching circuit in which the load impedance for the second harmonic is near-open while maintaining the fundamental signal matching as viewed from the end part of the output electrode of the semiconductor amplifying element. Even if the bias circuit is connected, the load impedance for the second harmonic is made near-open at the end part of the semiconductor amplifying element. This facilitates high-efficiency operation of the semiconductor amplifier. Such a semiconductor amplifier can be widely used in radar devices and microwave communication equipment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor amplifier comprising:
a semiconductor amplifying element including an input electrode and an output electrode;
an output terminal connected with an external load;
an output matching circuit including a bonding wire, a first transmission line having a first characteristic impedance and a first electrical length, and a second transmission line having a second characteristic impedance and a second electrical length, the bonding wire including one end part connected to the output electrode and the other end part connected to one end part of the first transmission line, the other end part of the first transmission line being connected to one end part of the second transmission line, the other end part of the second transmission line being connected to the output terminal, the first electrical length being 90° or less at an upper limit frequency of the prescribed band, the second characteristic impedance being larger than the first characteristic impedance; and
an output bias circuit including a third transmission line having an electrical length of approximately 90° at a center frequency in a prescribed band, a grounded shunt capacitor, and a power supply terminal, the third transmission line including one end part and the other end part connected to the grounded shunt capacitor, the one end part of the third transmission line being connected to the second transmission line at a position where an electrical length is approximately 45° from the one end part of the second transmission line at the center frequency, the power supply terminal being connected to the other end part of the third transmission line.

2. The amplifier according to claim 1, wherein the third characteristic impedance is larger than the second characteristic impedance.

3. The amplifier according to claim 1, wherein the semiconductor amplifying element is a field effect transistor made of a nitride-based semiconductor or $Al_xGa_{1-x}As$-based ($0 \leq x \leq 1$) semiconductor.

4. The amplifier according to claim 3, wherein the field effect transistor is a HEMT.

5. The amplifier according to claim 2, wherein the semiconductor amplifying element is a field effect transistor made of a nitride-based semiconductor or AlxGa1-xAs-based ($0 \leq x \leq 1$) semiconductor.

6. The amplifier according to claim 5, wherein the field effect transistor is a HEMT.

* * * * *